US007851287B2

(12) United States Patent  
Kim et al.

(10) Patent No.: US 7,851,287 B2
(45) Date of Patent: Dec. 14, 2010

(54) METHOD OF FABRICATING SCHOTTKY BARRIER FINFET DEVICE

(75) Inventors: Sung-Min Kim, Incheon (KR); Eun-Jung Yun, Seoul (KR); Dong-Won Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/759,290

(22) Filed: Apr. 13, 2010

(65) Prior Publication Data

US 2010/0197099 A1 Aug. 5, 2010

Related U.S. Application Data

(62) Division of application No. 11/598,374, filed on Nov. 13, 2006, now Pat. No. 7,723,762.

(30) Foreign Application Priority Data

Nov. 14, 2005 (KR) ............. 10-2005-0108790

(51) Int. Cl.
*H01L 21/336* (2006.01)
(52) U.S. Cl. ............... 438/197; 257/E21.409
(58) Field of Classification Search ......... 257/347, 257/401, 471, E29.178, E29.271, 213, 288; 438/142, 197, 180, 299
See application file for complete search history.

(56) References Cited

U.S. PATENT DOCUMENTS 6,303,479 B1 10/2001 Snyder
6,492,212 B1 12/2002 Ieong et al.
6,744,103 B2 6/2004 Snyder (Continued)

FOREIGN PATENT DOCUMENTS

JP 2003243667 8/2003

(Continued)

OTHER PUBLICATIONS

"Schottky Barrier FiNFET Device and Fabrication Method Thereof" Specification, Drawings, and Prosecution History of U.S. Appl. No. 11/598,374, filed Nov. 13, 2006, by Sung-Min Kim, et al., which is stored in the United States Patent and Trademark Office (USPTO) Image File Wrapper (IFW) system.

*Primary Examiner*—Sue A. Purvis
*Assistant Examiner*—Selim Ahmed
(74) *Attorney, Agent, or Firm*—Mills & Onello, LLP (57) ABSTRACT

A Schottky barrier FinFET device and a method of fabricating the same are provided. The device includes a lower fin body provided on a substrate. An upper fin body having first and second sidewalls which extend upwardly from a center of the lower fin body and face each other is provided. A gate structure crossing over the upper fin body and covering an upper surface of the upper fin body and the first and second sidewalls is provided. The Schottky barrier FinFET device includes a source and a drain which are formed on the sidewalls of the upper fin body adjacent to sidewalls of the gate structure and made of a metal material layer formed on an upper surface of the lower fin body positioned at both sides of the upper fin body, and the source and drain form a Schottky barrier to the lower and upper fin bodies.

10 Claims, 10 Drawing Sheets

U.S. PATENT DOCUMENTS

| | | |
|---|---|---|
| 7,119,402 B2 | 10/2006 | Kinoshita et al. |
| 2005/0093033 A1 | 5/2005 | Kinoshita et al. |
| 2006/0011984 A1 | 1/2006 | Currie |
| 2007/0007590 A1 | 1/2007 | Kinoshita et al. |
| 2007/0111435 A1 | 5/2007 | Kim et al. |
| 2007/0132009 A1* | 6/2007 | Takeuchi et al. ............ 257/321 |

FOREIGN PATENT DOCUMENTS

| | | |
|---|---|---|
| JP | 2004039694 | 2/2004 |
| KR | 1020040081873 | 9/2004 |
| KR | 1020050025096 | 3/2005 |
| WO | 2005036651 | 4/2005 |

* cited by examiner

METHOD OF FABRICATING SCHOTTKY BARRIER FINFET DEVICE

CROSS-REFERENCE TO RELATED APPLICATIONS

This application is a divisional application of U.S. patent application Ser. No. 11/598,374, filed on Nov. 13, 2006, which claims the benefit of Korean patent application number 10-2005-0108790, filed on Nov. 14, 2005, in the Korean Intellectual Property Office, the contents of which applications are incorporated herein in their entirety by reference.

BACKGROUND OF THE INVENTION

1. Field of the Invention

The present invention relates to a semiconductor device and a fabrication method thereof, and more particularly, to a Schottky barrier FinFET (Fin Field Effect Transistor) device and a fabrication method thereof.

2. Description of Related Art

A discrete device such as a MOSFET (Metal Oxide Silicon Field Effect Transistor) having a PN junction structure is being widely used as a switching device of a semiconductor device. Recently, due to demand for high integration and high performance of a semiconductor device, a method of scaling down the MOSFET has been researched. The scaling down of the MOSFET may improve integration density of the semiconductor device, reduce dimensions of the semiconductor device to improve the speed of a switching operation, and reduce distance between devices to improve a signal transmission speed. However, there is a limit to the extent to which the conventional MOSFET may be scaled down. That is, due to the scaling down of the MOSFET, problems result from a gate length, a thickness of a gate insulating layer, an operating voltage, a depth of impurity junctions, and so on. In order to scale down the MOSFET, the gate length should be shorter, the thickness of the gate insulating layer should be thinner, the operating voltage should be lower, and the depth of the impurity junctions should be shallower. However, a short-channel effect may be created when the gate length is shorter, leakage current characteristics should be considered when the thickness of the gate insulating layer is reduced, and a threshold voltage is lowered by lowering the operating voltage. Therefore, since the effects of leakage current of the MOSFET become larger and the impurity junction becomes shallower, resistance characteristics at the junction should be considered. As a result, there is a limit to how far the conventional MOSFET using the PN junction can be scaled down.

Alternatively, instead of the MOSFET using the conventional PN junction, a Schottky barrier tunnel transistor (SBTT) in which a source and a drain are formed using a Schottky junction has been proposed. Since in the SBTT, source and drain regions are formed using a metal, rather than diffusion of impurities, it is possible to form a very shallow junction. In addition, since the SBTT has various advantages such as being capable of reducing parasitic resistance and omitting an ion implantation process due to very low resistance of the metal, the SBTT is being looked to as a next-generation transistor.

An example of the SBTT is disclosed in U.S. Pat. No. 6,744,103 B2, entitled "Short-Channel Schottky Barrier MOSFET Device and Manufacturing Method", issued to Snyder. According to the Snyder patent, the Schottky barrier MOSFET can be manufactured using a manufacturing method including forming a silicon gate electrode on a semiconductor substrate, forming a thin insulating layer, i.e., oxide sidewalls, covering sidewalls of the silicon gate electrode to a thickness of about 100 Å, and forming source and drain regions on the substrate corresponding to both sides of the silicon gate electrode. In this process, the source and drain electrodes may be formed of a metal silicide layer.

Generally, a process of forming a metal silicide may include depositing a metal layer on a semiconductor substrate, and heat-treating the entire layer to react the metal layer with the semiconductor layer. The metal silicide layer formed as described above may be mainly formed on a surface where the metal layer is in contact with the semiconductor substrate. Therefore, since only a small amount of the metal silicide layer formed on the semiconductor substrate adjacent to the metal layer and not in contact with the metal layer, the oxide sidewalls of the Snyder patent have a small thickness so that the metal silicide layer used as source and drain electrodes can be formed more adjacent to the gate electrode. However, it may be difficult, using this method, to form a thin metal silicide layer, and thus a shallow source and drain junction, while forming the metal silicide layer more adjacent to the gate electrode.

SUMMARY OF THE INVENTION

An embodiment of the invention provides a Schottky barrier FinFET device and a method of fabricating the same.

In one aspect, the present invention is directed to a FinFET device comprising: a lower fin body disposed on a substrate; an upper fin body having first and second sidewalls extending upwardly from a portion of the lower fin body in which the first and second sidewalls face each other; a gate structure crossing over the upper fin body and covering an upper surface of the upper fin body and the first and second sidewalls; and a source and a drain disposed on sidewalls of the upper fin body adjacent to sidewalls of the gate structure, made of a metal material layer, and disposed on an upper surface of the lower fin body positioned at both sides of the upper fin body, wherein the source and drain form a Schottky barrier to the lower and upper fin bodies.

In one embodiment, the lower and upper fin bodies are formed of the same material layer which comprises at least one layer selected from the group consisting of a silicon (Si) layer, a germanium (Ge) layer, a silicon germanium (SiGe) layer, a silicon germanium carbide (SiGeC) layer, and a silicon carbide (SiC) layer.

In another embodiment, the metal material layer is a metal silicide layer.

In another embodiment, the metal silicide layer comprises at least one layer selected from the group consisting of a tantalum silicide (TaSi) layer, a titanium silicide (TiSi) layer, a tungsten silicide (WSi) layer, a nickel silicide (NiSi) layer, a cobalt silicide (CoSi) layer, a platinum silicide (PtSi) layer, an erbium silicide (ErSi) layer, a ytterbium silicide (YbSi) layer, a yttrium silicide (YSi) layer, a gadolinium silicide (GdSi) layer, a Terbium silicide (TbSi) layer, a dysprosium silicide (DySi) layer, a holmium silicide (HoSi) layer, a thulium silicide (TmSi) layer, a lutetium silicide (LuSi) layer, a palladium silicide (PdSi) layer, an osmium silicide (OsSi) layer, an iridium silicide (IrSi) layer, and a rhenium silicide (ReSi) layer.

In another embodiment, the FinFET device further comprises a gate spacer for covering the sidewalls of the gate structure.

In another aspect, the present invention is directed to a FinFET device comprising: a lower fin body disposed on a substrate; an upper fin body having first and second sidewalls extending upwardly from the lower fin body having third and fourth sidewalls; a gate structure crossing over the upper fin body and covering an upper surface of the upper fin body and the first and second sidewalls; a source and a drain disposed on sidewalls of the upper fin body adjacent to sidewalls of the gate structure, made of a metal material layer, and disposed on an upper surface of the lower fin body positioned at both sides of the upper fin body, wherein the source and drain form a Schottky barrier to the lower and upper fin bodies. The first and second sidewalls of the upper fin body are self-aligned with the third and fourth sidewalls of the lower fin is body, respectively.

In one embodiment, the gate structure extends from the first and second sidewalls of the upper fin body to cover the sidewalls of the lower fin body adjacent to the first and second sidewalls of the upper fin body.

In another aspect, the present invention is directed to a FinFET device comprising: a lower fin body disposed on a substrate; an upper fin body having first and second sidewalls extending upwardly from the lower fin body having third and fourth sidewalls; a source and a drain disposed on the first and second sidewalls of the fin body, made of a metal material layer, and disposed on an upper surface of the lower fin body positioned at both sides of the upper fin body, wherein the source and drain form a Schottky barrier to the lower and upper fin bodies; a gate dielectric layer on the top surface of the upper fin body; and a gate structure on the gate dielectric layer.

In one embodiment, the first and second sidewalls of the upper fin body are self-aligned with the third and fourth sidewalls of the lower fin body, respectively.

In another embodiment, the FinFET device further comprises first and second gate spacers for covering the sidewalls of the gate structure.

In another embodiment, the FinFET device further comprises third and fourth gate spacers connecting with a portion of the source and drain.

In another aspect, the present invention is directed to a method of fabricating a FinFET device comprising: forming a preliminary fin body on a substrate; forming a gate structure crossing over the preliminary fin body and covering an upper surface and sidewalls of the preliminary fin body; forming a gate spacer covering sidewalls of the gate structure; partially etching the preliminary fin body using the gate spacer and the gate structure as etching masks to form an upper fin body positioned under the gate structure and a lower fin body positioned at a lower level than the upper fin body, the upper fin body having exposed sidewalls; and forming a source and a drain of a metal material layer forming a Schottky barrier to the upper and lower fin bodies on surfaces of the exposed sidewalls of the upper fin body and an upper surface of the lower fin body positioned at both sides of the upper fin body.

In one embodiment, the preliminary fin body includes at least one layer selected from the group consisting of a silicon (Si) layer, a germanium (Ge) layer, a silicon germanium (SiGe) layer, a silicon germanium carbide (SiGeC) layer, and a silicon carbide (SiC) layer.

In another embodiment, the source and drain are formed of a metal silicide layer.

In another embodiment, the metal silicide layer comprises at least one layer selected from the group consisting of a tantalum silicide (TaSi) layer, a titanium silicide (TiSi) layer, a tungsten silicide (WSi) layer, a nickel silicide (NiSi) layer, a cobalt silicide (CoSi) layer, a platinum silicide (PtSi) layer, an erbium silicide (ErSi) layer, a ytterbium silicide (YbSi) layer, a yttrium silicide (YSi) layer, a gadolinium silicide (GdSi) layer, a Terbium silicide (TbSi) layer, a dysprosium silicide (DySi) layer, a holmium silicide (HoSi) layer, a thulium silicide (TmSi) layer, a lutetium silicide (LuSi) layer, a palladium silicide (PdSi) layer, an osmium silicide (OsSi) layer, an iridium silicide (IrSi) layer, and a rhenium silicide (ReSi) layer.

In another embodiment, forming the source and drain comprises: forming a metal layer on the surface of the substrate having the lower and upper fin bodies; heat-treating the substrate having the metal layer to react the lower and upper fin bodies with the metal layer; and removing an unreacted portion of the metal layer.

In another embodiment, the source and drain are self-aligned with the sidewalls of the gate structure, or overlap the gate structure.

In another embodiment, the method of fabricating a FinFET device further comprises a step of forming a gate dielectric layer between the preliminary fin body and the gate structure.

In another aspect, the present invention is directed to a method of fabricating a FinFET device comprising: forming a fin body on a substrate; forming a sacrificial mask crossing over the fin body and covering an upper surface and sidewalls of the fin body; forming a source and a drain of a metal material layer forming a Schottky barrier to the fin body on surfaces of the fin body positioned at both sides of the sacrificial mask; forming an insulating pattern surrounding sidewalls of the sacrificial mask and covering the fin body; removing the sacrificial mask to form an opening for exposing a portion of the fin body; and forming a gate structure covering the exposed fin body.

In one embodiment, the fin body comprises at least one layer selected from the group consisting of a silicon (Si) layer, a germanium (Ge) layer, a silicon germanium (SiGe) layer, a silicon germanium carbide (SiGeC) layer, and a silicon carbide (SiC) layer.

In another embodiment, the source and drain are formed of a metal silicide layer.

In another embodiment, the metal silicide layer comprises at least one layer selected from the group consisting of a tantalum silicide (TaSi) layer, a titanium silicide (TiSi) layer, a tungsten silicide (WSi) layer, a nickel silicide (NiSi) layer, a cobalt silicide (CoSi) layer, a platinum silicide (PtSi) layer, an erbium silicide (ErSi) layer, a ytterbium silicide (YbSi) layer, a yttrium silicide (YSi) layer, a gadolinium silicide (GdSi) layer, a Terbium silicide (TbSi) layer, a dysprosium silicide (DySi) layer, a holmium silicide (HoSi) layer, a thulium silicide (TmSi) layer, a lutetium silicide (LuSi) layer, a palladium silicide (PdSi) layer, an osmium silicide (OsSi) layer, an iridium silicide (IrSi) layer, and a rhenium silicide (ReSi) layer.

In another embodiment, forming the source and drain comprises: forming a metal layer on the substrate having the sacrificial layer; heat-treating the substrate having the metal layer to react the fin body with the metal layer; and removing an unreacted portion of the metal layer.

In another embodiment, the insulating pattern is formed of a material layer having an etching selectivity with respect to the sacrificial mask.

In another embodiment, the gate structure is formed of a gate insulating layer and a gate electrode, which are sequentially stacked.

In another embodiment, the gate insulating layer is formed using a chemical vapor deposition method or an atomic layer deposition method, and the gate electrode comprises at least one layer selected from the group consisting of a silicon layer, a metal layer, and a metal silicide layer.

In another embodiment, the source and drain are self-aligned with sidewalls of the gate structure, or overlap the gate structure.

In another embodiment, forming the sacrificial mask comprises: forming a preliminary sacrificial mask crossing over the fin body and covering an upper surface and sidewalls of the fin body, the preliminary sacrificial mask having a first width; and isotropically etching the preliminary sacrificial mask to cross over the fin body having a second width smaller than the first width.

In another aspect, the present invention is directed to a method of fabricating a FinFET device comprising: forming a lower fin body on a substrate; forming an upper fin body having first and second sidewalls extending upwardly from the lower fin body having third and fourth sidewalls; forming a gate dielectric layer on the top surface of the upper fin body; forming a source and a drain on the first and second sidewalls of the fin body, made of a metal material layer, and on an upper surface of the lower fin body positioned at both sides of the upper fin body, wherein the source and drain form a Schottky barrier to the lower and upper fin bodies; and forming a gate structure on the gate dielectric layer.

In one embodiment, the first and second sidewalls of the upper fin body are self-aligned with the third and fourth sidewalls of the lower fin body, respectively.

In another embodiment, the method further comprises forming first and second gate spacers for covering the sidewalls of the gate structure.

In another embodiment, the method further comprises forming third and fourth gate spacers connecting with a portion of the source and drain.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention. In the drawings, the thickness of layers and regions are exaggerated for clarity.

FIGS. 8A to 12A and 8B to 12B are cross-sectional views showing methods of fabricating FinFET devices in accordance with other embodiments of the present invention.

DETAILED DESCRIPTION OF PREFERRED EMBODIMENTS OF THE INVENTION

Figure 1:
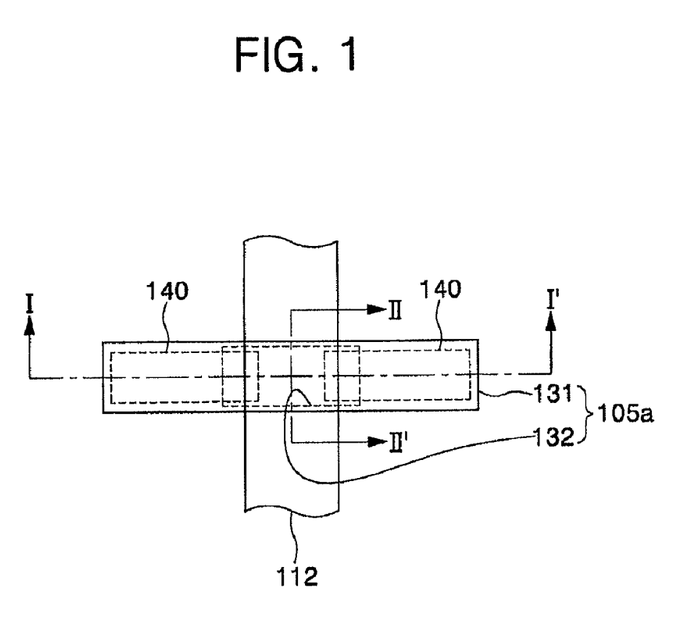
FIG. 1 is a plan view of a FinFET device in accordance with embodiments of the present invention.
Figure 4:
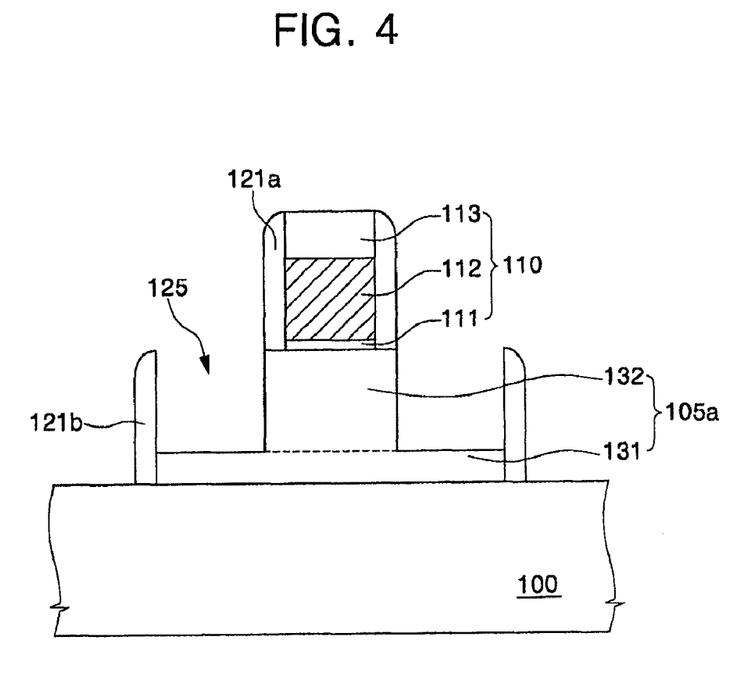
Figure 5A:
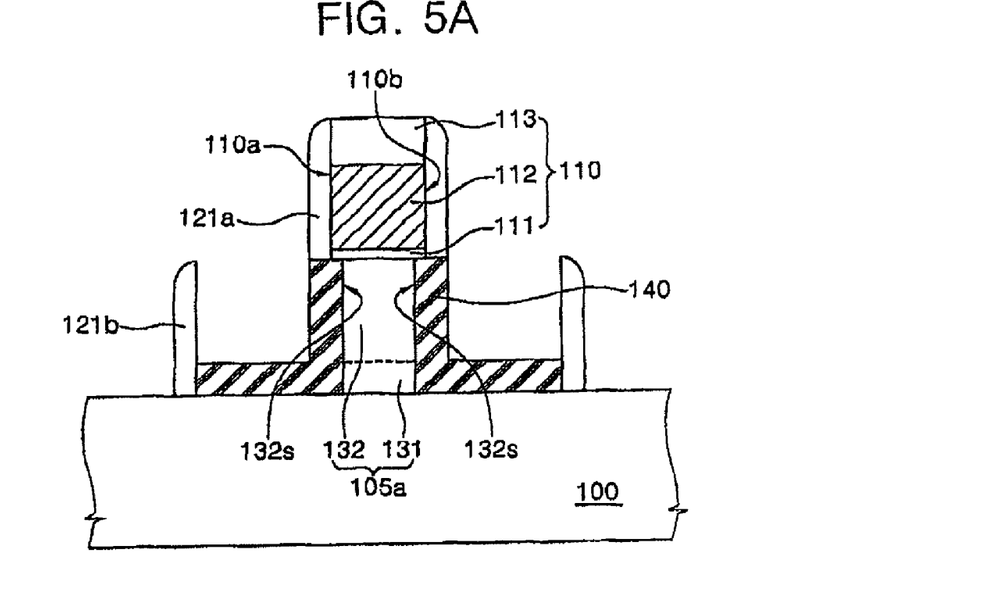
Figure 5B:
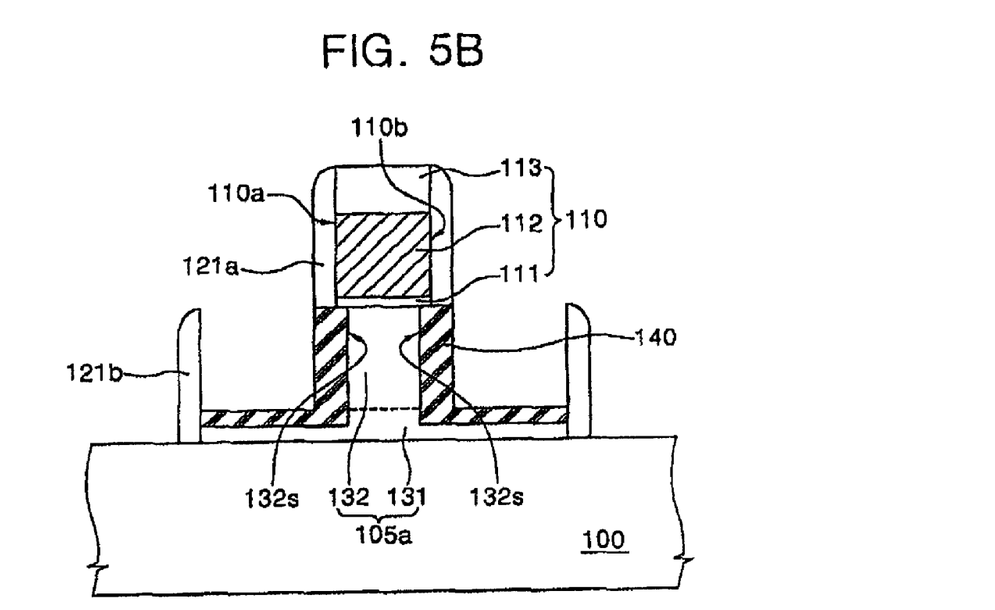
Figure 6:
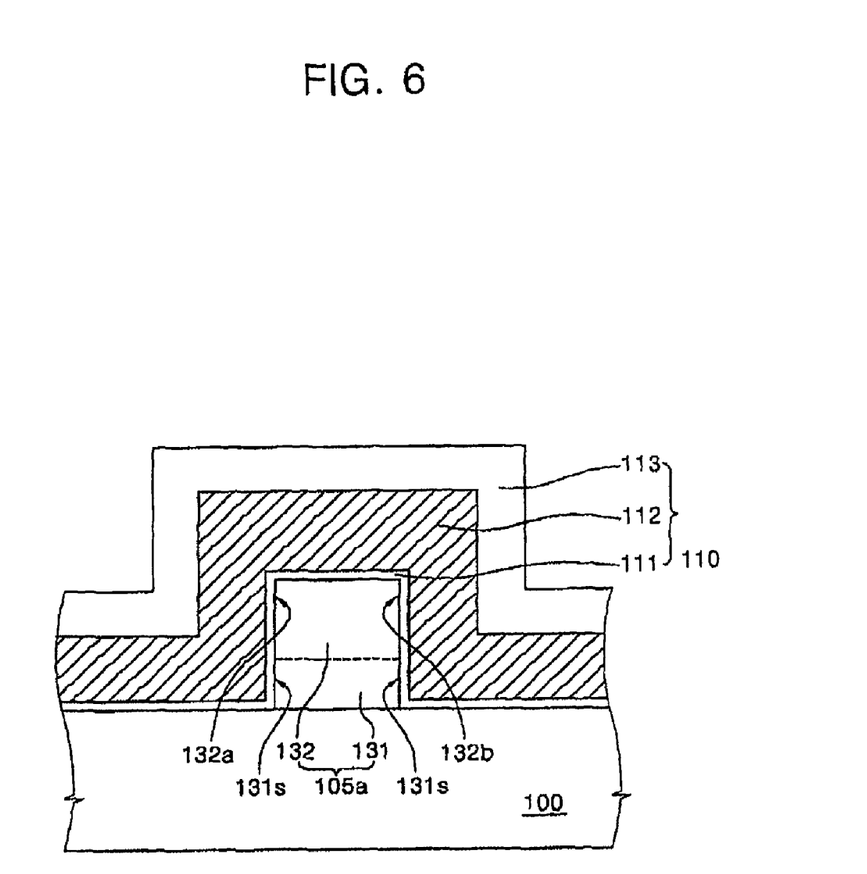
Figure 7:
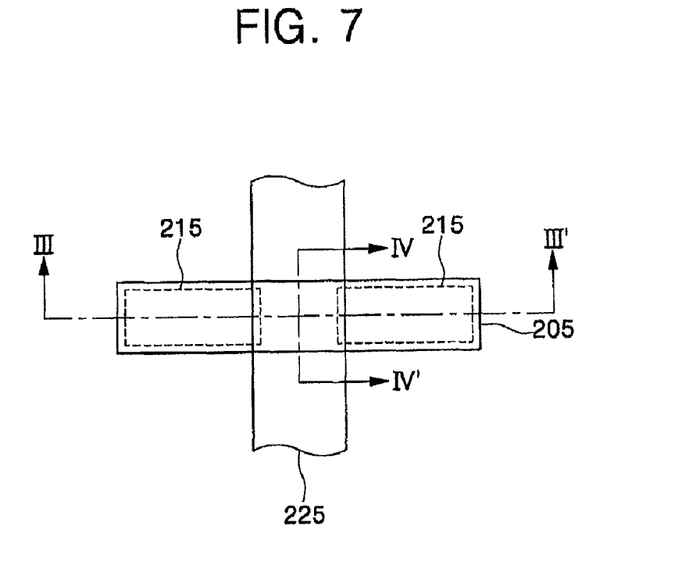
FIG. 7 is a plan view of a FinFET device in accordance with other embodiments of the present invention.

FIG. 1 is a plan view of a FinFET device in accordance with embodiments of the present invention, FIGS. 2 to 5B are cross-sectional views taken along line I-I' in FIG. 1, FIG. 6 is a cross-sectional view taken along line II-II' in FIG. 1, FIG. 7 is a plan view of a FinFET device in accordance with other embodiments of the present invention, FIGS. 8A, 9A, 10A, 11A and 12A are cross-sectional views taken along line III-III' in FIG. 7, and FIGS. 8B, 9B, 10B, 11B and 12B are cross-sectional views taken along line IV-IV' in FIG. 7.

First, a structure of a FinFET device in accordance with embodiments of the present invention will now be described with reference to FIGS. 1, 5A, 5B, and 6.

Referring to FIGS. 1, 5A, 5B, and 6, at least one lower fin body 131 is provided on a substrate 100. The substrate 100 may be a bulk semiconductor substrate or a silicon on insulator (SOI) substrate. When the substrate 100 is a bulk semiconductor substrate, the lower fin body 131 may be formed of the substrate 100 and projected from the substrate 100. In this case, an isolation layer may be provided in the substrate 100 adjacent to the lower fin body 131. In addition, when the substrate 100 is formed of an SOI substrate, a lower region of the substrate 100 may be a semiconductor substrate, and an upper region of the substrate 100 may be a buried insulating layer.

An upper fin body 132 having first and second sidewalls 132a and 132b extending upwardly from a portion of the lower fin body 131, appropriately from the center of the lower fin body 131. The first and second sidewalls 132a and 132b are facing each other. The first and second sidewalls 132a and 132b of the upper fin body 132 may be self-aligned with sidewalls 131s of the lower fin body 131. The lower and upper fin bodies 131 and 132 may constitute a fin body 105a. The lower and upper fin bodies 131 and 132 may be formed of the same semiconductor material layer. For example, the lower and upper fin bodies 131 and 132 may be formed of a silicon (SI) layer, a Germanium (Ge) layer, a silicon germanium (SiGe) layer, a silicon germanium carbide (SiGeC) layer, or a silicon carbide (SiC) layer.

A gate structure 110 is provided to cross over the upper fin body 132 and cover an upper surface and the first and second sidewalls 132a and 132b of the upper fin body 132. The gate structure 110 may extend to cross over the upper fin body 132, and to cover the first and second sidewalls 132a and 132b and the upper surface of the upper fin body 132, and the sidewalls 131s of the lower fin body 131 adjacent to the first and second sidewalls 132a and 132b of the upper fin body 132. The gate structure 110 may include a gate insulating layer 111, a gate electrode 112, and a hard mask 113, which are sequentially stacked. The gate insulating layer 111 may be formed of a silicon oxide layer or a high-k dielectric layer. The high-k dielectric layer may include at least one selected from the group consisting of a $(Ba_x, Sr_{1-x})TiO_3$ (hereinafter referred to as "BST") layer, a $TiO_2$ layer, a $Ta_2O_5$ layer, a Zr-silicate layer, a $HfO_2$ layer, a Hf-silicate layer, an $Al_2O_3$ layer, and a $Y_2O$ layer. The gate electrode 112 may include at least one selected from the group consisting of a silicon layer, a metal silicide layer, and a metal layer. The hard mask 113 may be formed of a silicon nitride layer or a silicon oxide layer.

Meanwhile, the hard mask 113 may be not formed. In this case, the gate structure 110 may be formed of a gate insulating layer 111, and a gate electrode 112, which are sequentially stacked.

A gate spacer 121a covering sidewalls of the gate structure 110 may be provided. The gate spacer 121a may include a silicon oxide layer or a silicon nitride layer.

A source and a drain 140 are formed on the sidewalls 132s of the upper fin body 132 adjacent to the sidewalls 110a and 110b of the gate structure 110 and on an upper surface of the lower fin body 131 positioned at both sides of the upper fin body 132. The source and drain 140 are formed of a metal material layer. The source and drain 140 may form a Schottky barrier to the lower and upper fin bodies 131 and 132. For example, the source and drain 140 may be formed of a metal silicide layer including at least one selected from the group consisting of a tantalum silicide (TaSi) layer, a titanium silicide (TiSi) layer, a tungsten silicide (WSi) layer, a nickel silicide (NiSi) layer, a cobalt silicide (CoSi) layer, a platinum silicide (PtSi) layer, an erbium silicide (ErSi) layer, a ytterbium silicide (YbSi) layer, a yttrium silicide (YSi) layer, a gadolinium silicide (GdSi) layer, a Terbium silicide (TbSi) layer, a dysprosium silicide (DySi) layer, a holmium silicide (HoSi) layer, a thulium silicide (TmSi) layer, a lutetium silicide (LuSi) layer, a palladium silicide (PdSi) layer, an osmium silicide (OsSi) layer, an iridium silicide (IrSi) layer, and a rhenium silicide (ReSi) layer. The source and drain 140 may be self-aligned with the sidewalls of the gate electrode 112, or overlap the gate electrode 112, while forming a shallow junction.

Therefore, the source and drain 140 provided on the sidewalls 132s of the upper fin body 132 adjacent to the sidewalls 110a and 110b of the gate structure 110, made of a metal material layer, and extending to an upper surface of the lower fin body 131 positioned at both sides of the upper fin body 132 are provided. As a result, a Schottky barrier FinFET device including the source and drain 140 may be provided. The Schottky barrier FinFET device fabricated as described above may have a short channel length. Furthermore, since the fin body 105a is used as a channel region, the Schottky barrier FinFET device may have a channel width greater than that of the conventional Schottky barrier MOSFET device. In addition, regardless of the thickness and channel length of a fin, the source and drain 140 may be formed of only a metal material layer. That is, since the source and drain 140 adjacent to a channel region under the gate electrode 112 are formed of a metal material layer, junction leakage current of the source and drain 140 may be minimized. In addition, the source and drain 140 may be self-aligned with the sidewalls of the gate structure 110, or overlap the gate structure 110, while forming a shallow junction.

Consequently, a Schottky barrier FinFET device having an electrically stabled short channel length can be provided. Furthermore, it is possible to improve current drivability of the device and an operating speed of the device.

Next, a method of fabricating a Schottky barrier FinFET device in accordance with embodiments of the present invention will be described with reference to FIGS. 1 to 6.

Figure 2:
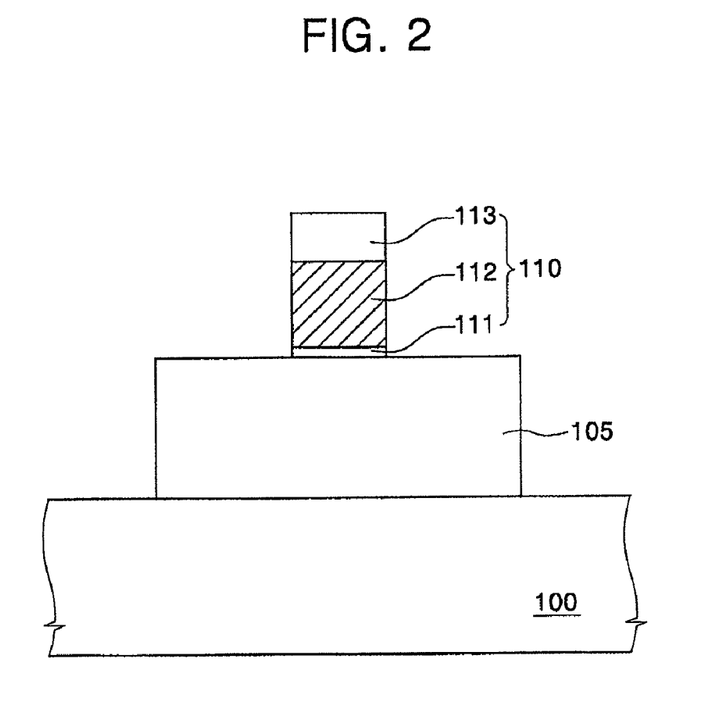
FIGS. 2 to 6 are cross-sectional views showing methods of fabricating FinFET devices in accordance with embodiments of the present invention.

Referring to FIGS. 1 and 2, a substrate 100 is prepared. At least one preliminary fin body 105 is formed on the substrate 100. The preliminary fin body 105 may be formed of a semiconductor material layer. For example, the preliminary fin body 105 may be formed of a silicon (Si) layer, a germanium (Ge) layer, a silicon germanium (SiGe) layer, a silicon germanium carbide (SiGeC) layer, or a silicon carbide (SiC) layer. A method of forming the preliminary fin body 105 may be varied depending on the kind of the substrate 100. For example, when the substrate 100 is a bulk semiconductor substrate, the preliminary fin body 105 made of the substrate 100 and projecting from the substrate 100 may be provided. In this case, an isolation layer may be provided in the substrate 100 adjacent to the preliminary fin body 105. Therefore, the preliminary fin body 105 and the other preliminary fin body adjacent thereto may be isolated by the isolation layer provided in the substrate 100. On the other hand, when the substrate 100 is formed of an SOI substrate, a lower region of the substrate 100 may be a semiconductor substrate, and an upper region of the substrate 100 may be a buried insulating layer. Therefore, the preliminary fin body 105 may be formed on the buried insulating layer and isolated from the other preliminary fin body.

A gate structure 110 crossing over the preliminary fin body 105 and covering an upper surface and sidewalls of the preliminary fin body 105 is formed. The gate structure 110 may include a gate insulating layer 111, a gate electrode 112, and a hard mask 113, which are sequentially stacked. The gate insulating layer 111 may be formed of a silicon oxide layer or a high-k dielectric layer. The high-k dielectric layer may include at least one selected from the group consisting of a BST layer, a $TiO_2$ layer, a $Ta_2O_5$ layer, a Zr-silicate layer, a $HfO_2$ layer, a Hf-silicate layer, an $Al_2O_3$ layer, and a $Y_2O$ layer. The gate electrode 112 may be formed of at least one selected from the group consisting of a silicon layer, a metal silicide layer, and a metal layer. The hard mask 113 may be formed of a silicon nitride layer or a silicon oxide layer.

The hard mask 113 may be not formed. When the hard mask 113 is not formed, the gate structure 110 may be formed of a gate insulating layer 111, and a gate electrode 112, which are sequentially stacked.

Figure 3:
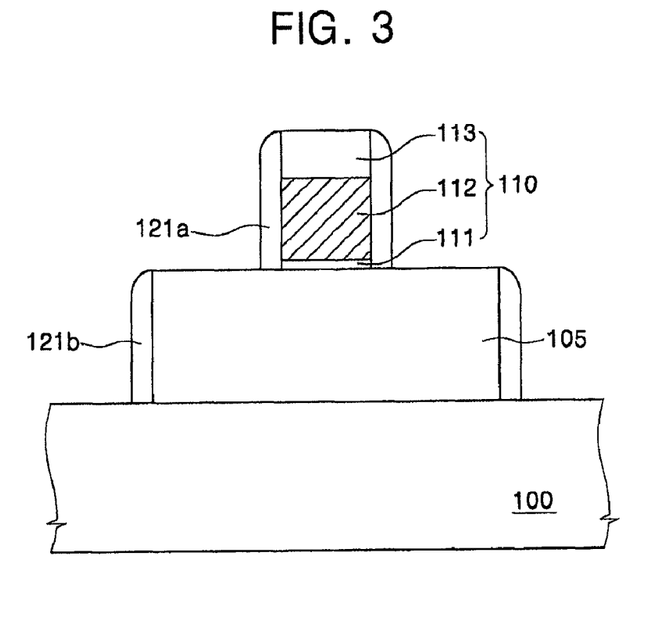

Referring to FIGS. 1 and 3, a gate spacer 121a covering sidewalls of the gate structure 110 is formed, while forming a fin body spacer 121b covering sidewalls of the preliminary fin body 105. Forming the gate spacer 121a and the fin body spacer 121b may include forming a conformal spacer insulating layer on the substrate having the gate structure 110, and anisotropically etching the spacer insulating layer. On the other hand, when the gate electrode 112 is formed of a silicon layer, forming the gate spacer 121a and the fin body spacer 121b may include thermally oxidizing the substrate having the gate structure 110 to form a thermal oxide layer on the gate electrode 112 and the preliminary fin body 105, and anisotropically etching the thermal oxide layer. As a result, an upper surface 105 of the preliminary fin body 105 may be exposed except regions at which the gate structure 110 and the gate spacer 121a are formed.

Referring to FIGS. 1 and 4, the preliminary fin body 105 is partially etched using the gate structure 110 and the gate spacer 121a as etching masks to form an upper fin body 132 positioned under the gate structure 110 and a lower fin body 131 positioned at a level lower than that of the upper fin body 132. The lower and upper fin bodies 131 and 132 may constitute a fin body 105a. The preliminary fin body 105 positioned at both sides of the gate structure 110 may be partially etched to form a recess region 125. As a result, the fin body 105a including the lower and upper fin bodies 131 and 132 may be formed.

Referring to FIGS. 1, 5A, 5B, and 6, a source and a drain 140 are formed on the sidewalls of the upper fin body 132 adjacent to the sidewalls of the gate structure 110 and on a surface of the lower fin body 131 positioned at both sides of the upper fin body 132. In this case, the source and drain 140 are formed of the same metal material layer as the metal silicide layer forming a Schottky barrier to the lower and upper fin bodies 131 and 132. Specifically, forming the source and drain 140 may include forming a metal layer on the substrate having the fin body 105a, performing a heat-treatment process of reacting the fin body 105a with the metal layer to form a metal silicide layer, and removing an unreacted portion of the metal layer. In this case, the metal layer reacts with the fin body 105a to form the metal silicide layer, and the thickness of the metal silicide layer may increase toward a lower part of the gate structure 110. That is, metal silicide layers formed on the sidewalls of the upper fin body 132 are formed opposite to each other about a channel region under the gate structure 110 disposed therebetween. Therefore, since the thickness of the metal silicide layer increases, the metal silicide layer may be formed such that the metal silicide layer and the sidewalls of the gate structure 110 are self-aligned to each other or the metal silicide layer and the gate structure 110 overlaps each other. The thickness of the metal silicide layer can be adjusted depending on the kind of the metal layer, an initial thickness of the metal layer, the temperature and time of the heat-treatment process. Therefore, regardless of the thickness and channel length of a fin, the source and drain 140 may be formed of only a metal silicide layer. Since the metal silicide layer becomes the source and drain 140, the source and drain 140 may be formed to have a shallow junction, and junction leakage current of the source and drain 140 may be minimized. The source and drain 140 may be self-aligned with the sidewalls of the gate structure 110, or overlap the gate structure 110, while forming the shallow junction. As shown FIG. 5B, a portion of the lower fin body 131 may remain under the source and drain. Therefore, it is possible to form a Schottky barrier FinFET device having a short channel length.

The source and drain 140 may be formed of a metal silicide layer including at least one selected from the group consisting of a tantalum silicide (TaSi) layer, a titanium silicide (TiSi) layer, a tungsten silicide (WSi) layer, a nickel silicide (NiSi) layer, a cobalt silicide (CoSi) layer, a platinum silicide (PtSi) layer, an erbium silicide (ErSi) layer, a ytterbium silicide (YbSi) layer, a yttrium silicide (YSi) layer, a gadolinium silicide (GdSi) layer, a Terbium silicide (TbSi) layer, a dysprosium silicide (DySi) layer, a holmium silicide (HoSi) layer, a thulium silicide (TmSi) layer, a lutetium silicide (LuSi) layer, a palladium silicide (PdSi) layer, an osmium silicide (OsSi) layer, an iridium silicide (IrSi) layer, and a rhenium silicide (ReSi) layer.

While not shown, a conventional metallization process may be performed on the substrate having the source and drain 140. That is, the process may include forming an interlayer insulating layer on the substrate having the source and drain 140, forming a contact structure passing through the interlayer insulating layer and electrically connected to the source and drain 140, and forming a metal interconnection covering the contact structure on the interlayer insulating layer.

The metallization process may be performed after removing the fin body spacer 121b using a conventional etching process.

Consequently, the source and drain 140 provided on the sidewalls of the upper fin body 132 adjacent to the sidewalls of the gate structure 110, made of a metal material layer, and extending to an upper surface of the lower fin body 131 positioned at both sides of the upper fin body 132 are formed. Therefore, a Schottky barrier FinFET device including the source and drain 140 may be formed. The Schottky barrier FinFET device fabricated as described above may have a short channel length. Furthermore, since the fin body 105a is used as a channel region, the Schottky barrier FinFET device may have a channel width greater than that of the conventional Schottky barrier MOSFET device. In addition, regardless of the thickness and channel length of a fin, the source and drain 140 may be formed of only a metal material layer. Since the source and drain 140 adjacent to a channel region under the gate electrode 112 are formed of a metal material layer such as a metal silicide layer, junction leakage current of the source and drain 140 may be minimized. In addition, the source and drain 140 may be self-aligned with the sidewalls of the gate structure 110, or overlap the gate structure 110, while forming a shallow junction.

Consequently, it is possible to form a Schottky barrier FinFET device having an electrically stable short channel length. Furthermore, current drivability of the device can be improved, and operating speed of the device can be improved.

Hereinafter, methods of fabricating a FinFET device in accordance with other embodiments of the present invention will be described with reference to FIGS. 7, 8A to 12A, and 8B to 12B.

Figure 8A:
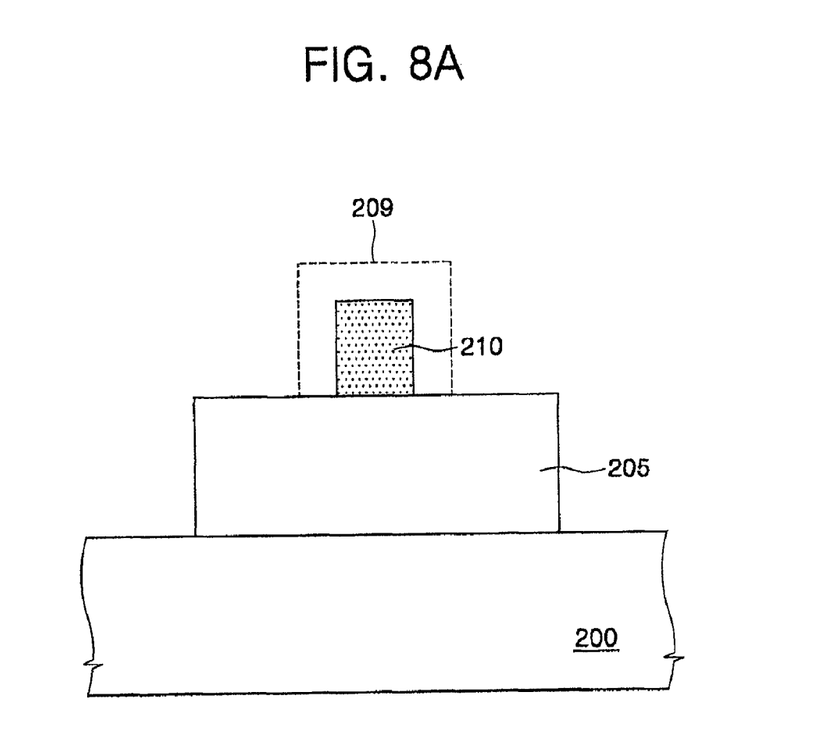
Figure 8B:
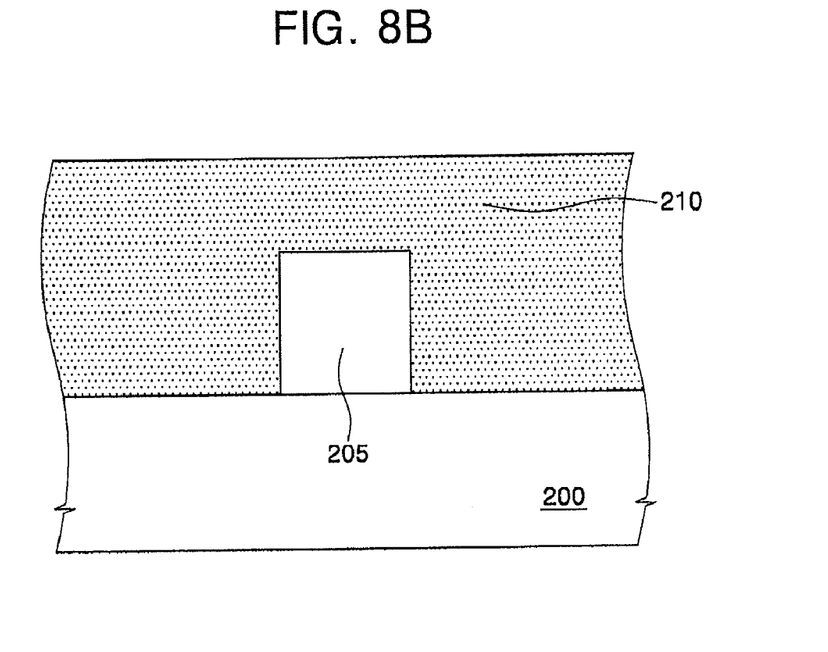

Referring to FIGS. 7, 8A and 8B, a substrate 200 is prepared. At least one fin body 205 is formed on the substrate 200. The fin body 205 may be formed of a semiconductor material layer. Since a method of forming the fin body 205 is substantially similar to the method of forming the preliminary fin body 105 described with reference to FIGS. 1 and 2, detailed description of the method of forming the fin body 205 will not be repeated. The fin body 205 may be formed of a silicon (Si) layer, a germanium (Ge) layer, a silicon germanium (SiGe) layer, a silicon germanium carbide (SiGeC) layer, or a silicon carbide (SiC) layer.

A sacrificial mask 210 crossing over the fin body 205 and covering an upper surface and sidewalls of the fin body 205 is formed. The sacrificial mask 210 may be formed of an insulating layer such as a silicon oxide layer or a silicon nitride layer.

The sacrificial mask 210 may be formed to have a line width smaller than that formed through a photolithography process. Specifically, a preliminary sacrificial mask 209 crossing over the fin body 205 and covering an upper surface and sidewalls of the fin body 205 may be formed, and then, the preliminary sacrificial mask 209 may be isotropically etched to form a sacrificial mask 210 having a width smaller than that of the preliminary sacrificial mask 209.

Figure 9A:
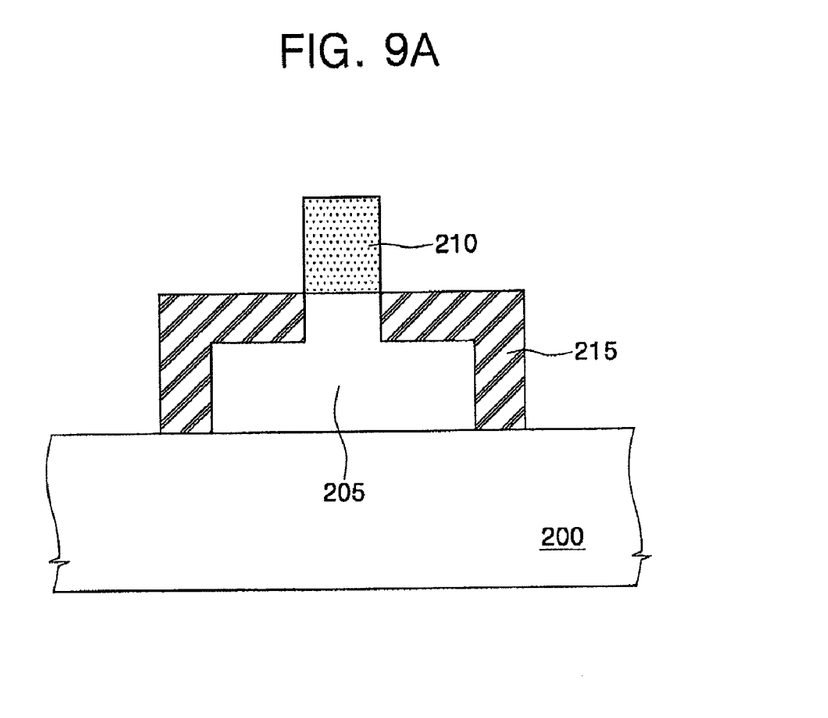
Figure 9B:
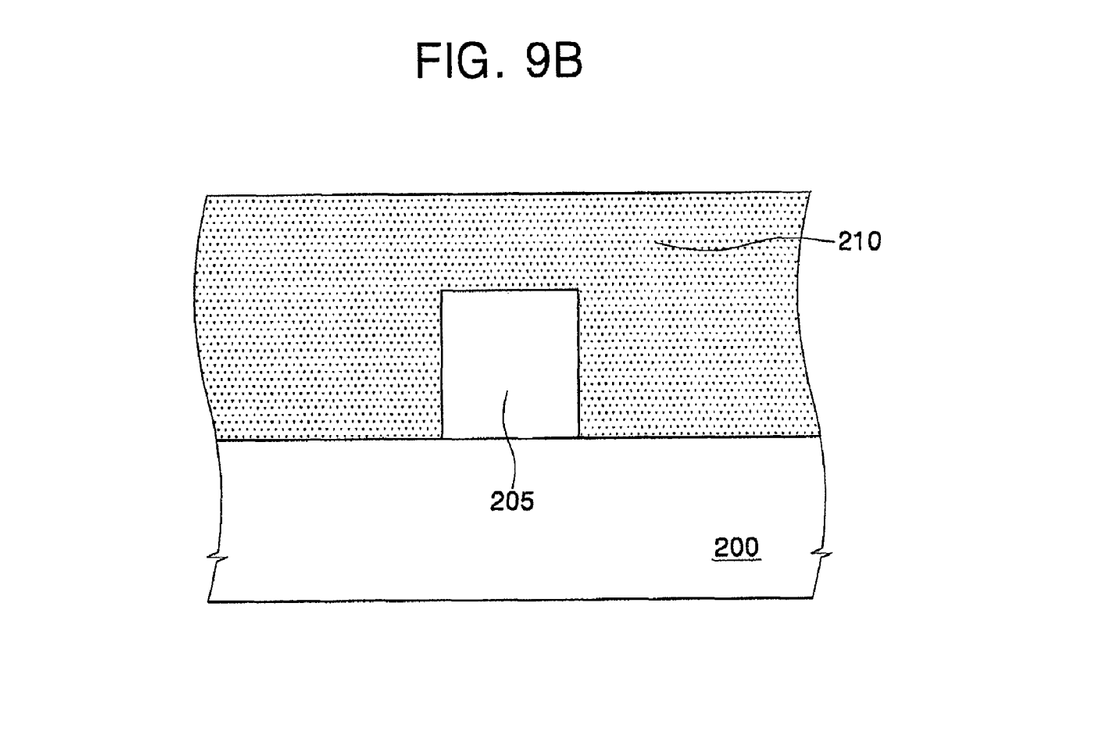

Referring to FIGS. 7, 9A and 9B, a source and a drain 215 are formed on a surface of the fin body 205 positioned at both sides of the sacrificial mask 210. That is, the source and drain 215 may be spaced apart from each other about the sacrificial mask 210. The source and drain 215 are formed of a metal material layer forming a Schottky barrier to the fin body 205. The metal material layer may be a metal layer or a metal silicide layer. Forming the source and drain 215 made of the metal silicide layer may include forming a metal layer on the substrate having the fin body 205, performing a heat-treatment process of reacting the fin body 205 with the metal layer to form a metal silicide layer, and removing an unreacted portion of the metal layer. In this case, the thickness of the metal silicide layer can be adjusted depending on the kind of the metal layer, an initial thickness of the metal layer, the temperature and time of the heat-treatment process. The source and drain 215 may be formed of a metal silicide layer including at least one layer selected from the group consisting of a tantalum silicide (TaSi) layer, a titanium silicide (TiSi) layer, a tungsten silicide (WSi) layer, a nickel silicide (NiSi) layer, a cobalt silicide (CoSi) layer, a platinum silicide (PtSi) layer, an erbium silicide (ErSi) layer, a ytterbium silicide (YbSi) layer, a yttrium silicide (YSi) layer, a gadolinium silicide (GdSi) layer, a Terbium silicide (TbSi) layer, a dysprosium silicide (DySi) layer, a holmium silicide (HoSi) layer, a thulium silicide (TmSi) layer, a lutetium silicide (LuSi) layer, a palladium silicide (PdSi) layer, an osmium silicide (OsSi) layer, an iridium silicide (IrSi) layer, and a rhenium silicide (ReSi) layer.

Figure 10A:
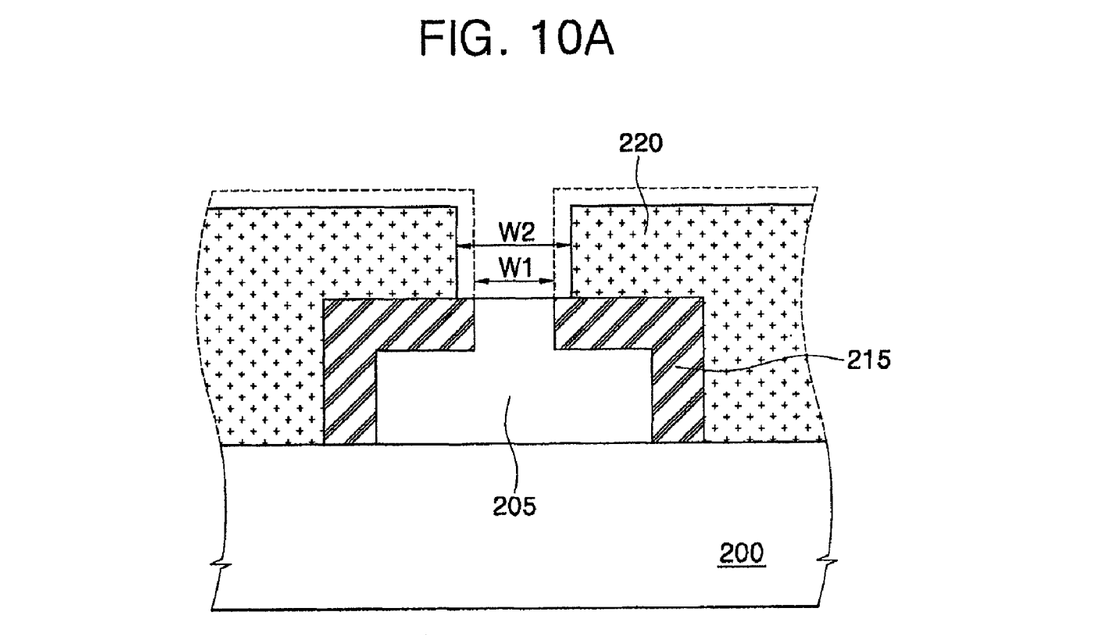
Figure 10B:
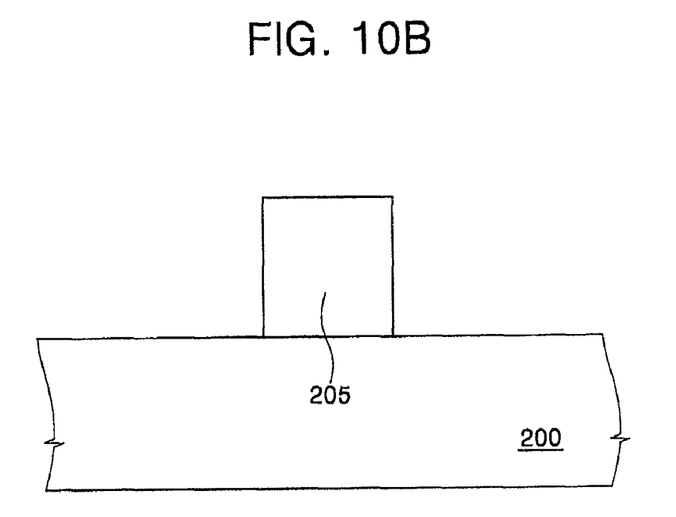

Referring to FIGS. 7, 10A and 10B, an insulating pattern 220 surrounding sidewalls of the sacrificial mask 210 and covering the fin body 205 is formed. The insulating pattern 220 may be formed of a material layer having an etching selectivity with respect to the sacrificial mask 210. For example, when the sacrificial layer is formed of a silicon oxide layer, the insulating pattern 220 may be formed of a silicon nitride layer. On the other hand, when the sacrificial mask 210 is formed of a silicon nitride layer, the insulating pattern 220 may be formed of a silicon oxide layer.

Then, the sacrificial mask 210 is selectively etched to form an opening for exposing a portion of the fin body 205. The sacrificial mask 210 may be removed using a conventional etching process. The opening may be formed to have a first width W1.

While the sacrificial mask 210 is removed by an etching process, a predetermined portion of the insulating pattern 220 may be etched. As a result, the opening may have a second width W2 greater than the first width W1. Therefore, a predetermined region of the source and drain 215 may be exposed.

Figure 11A:
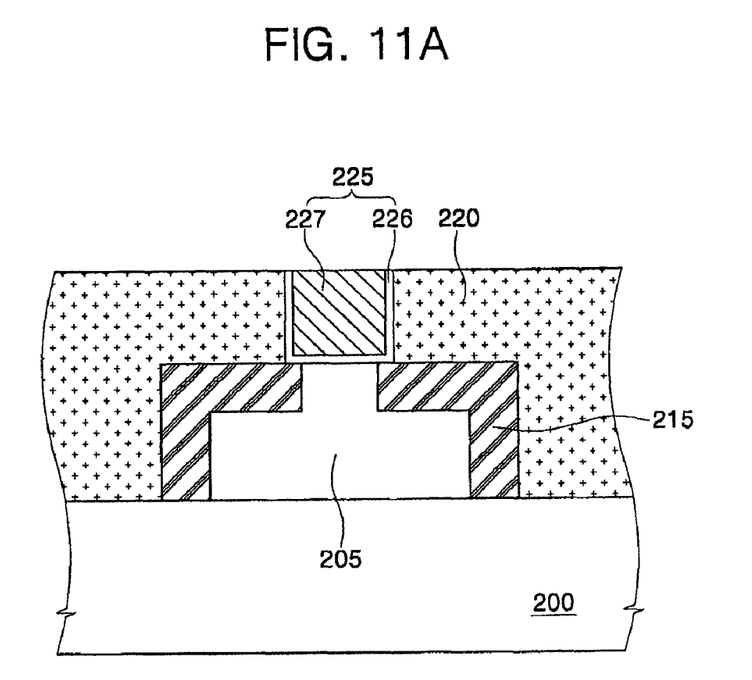
Figure 11B:
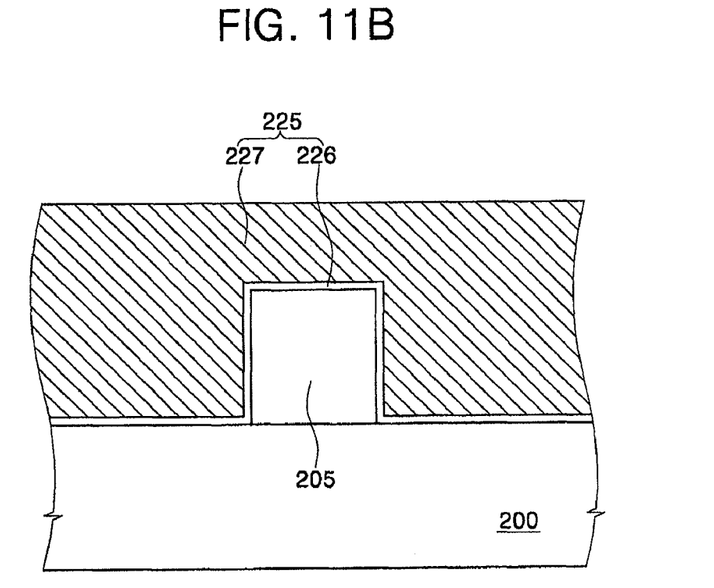

Referring to FIGS. 7, 11A and 11B, a gate structure 225 covering the fin body 205 exposed by the opening is formed. The gate structure 225 may be formed of a gate insulating layer 226 and a gate electrode 227, which are sequentially stacked. The gate insulating layer 226 may be formed by a chemical vapor deposition method or an atomic layer deposition method. For example, the gate insulating layer 226 may be formed of a silicon oxide layer, a silicon nitride layer, or a high-k dielectric layer. The high-k dielectric layer may include at least one layer selected from the group consisting of a BST layer, a $TiO_2$ layer, a $Ta_2O_5$ layer, a Zr-silicate layer, a $HfO_2$ layer, a Hf-silicate layer, an $Al_2O_3$ layer, and a $Y_2O$ layer. The gate electrode 227 may be formed of at least one selected from the group consisting of a silicon layer, a metal silicide layer, and a metal layer.

The gate electrode 227 may be formed of a metal layer such as tungsten. That is, since the gate electrode 227 is formed after forming the source and drain 215, the gate electrode 227 may be formed as a single metal layer. In the MOSFET made by using a conventional polysilicon layer as a gate electrode, a polysilicon depletion phenomenon that an electrical equivalent thickness of a gate insulating layer increases to decrease a driving current may be generated to degrade characteristics of the device. However, since the gate electrode 227 may be formed of a metal layer, it is possible to prevent the polysilicon depletion phenomenon from occurring.

Forming the gate structure 225 may include forming a conformal preliminary gate insulating layer on the substrate having the insulating pattern 220, forming a gate conductive layer filling the opening on the substrate having the preliminary gate insulating layer, and planarizing the gate conductive layer until an upper surface of the insulating pattern 220 is exposed to form a gate electrode 227 remaining in the opening and a gate insulating layer 226 remaining under the gate electrode 227 and on sidewalls of the gate electrode 227. As a result, a FinFET device including the source and drain 215 formed on the fin body 205 may be formed. In addition, the gate insulating layer 226 and the gate electrode 227 may be formed on a channel region between the source and drain 215. Furthermore, sidewalls of the gate electrode 227 and the source and drain 215 may be self-aligned to each other, or the gate electrode 227 and the source and drain 215 may overlap each other.

Figure 12A:
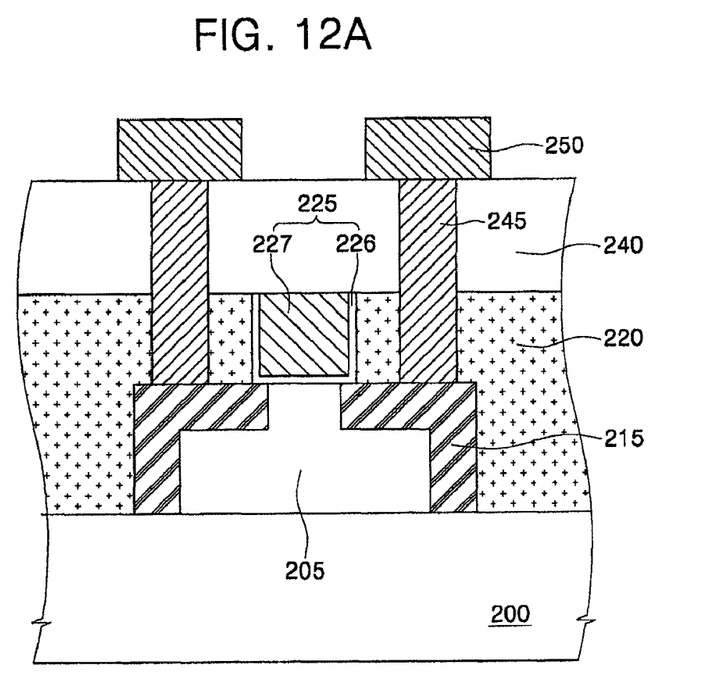
Figure 12B:
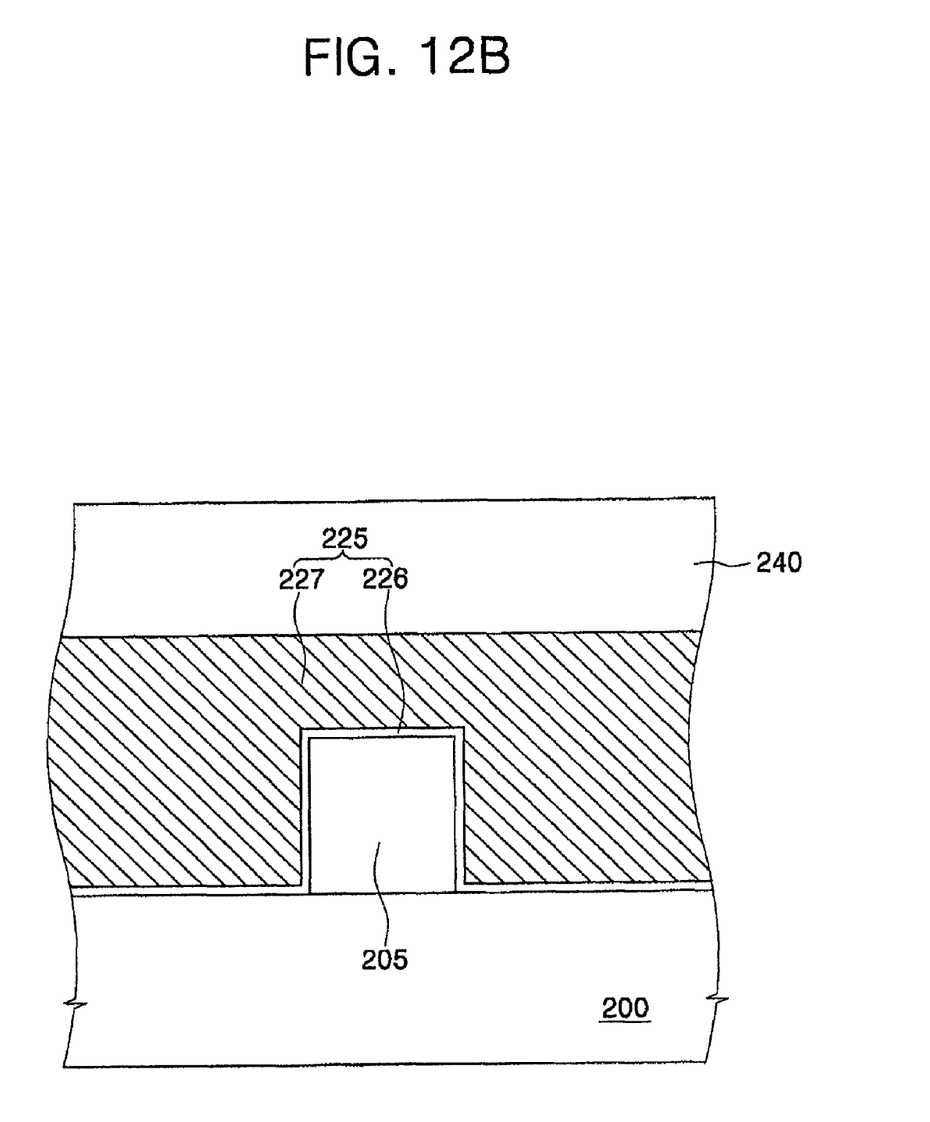

Referring to FIGS. 7, 12A and 12B, an interlayer insulating layer 240 may be formed on the substrate having the gate structure 225, and contact structures 245 passing through the interlayer insulating layer 240 and the insulating pattern 220 and electrically connected to the source and drain 215 may be formed. Then, a metal interconnection 250 covering the contact structures 245 may be formed on the interlayer insulating layer 240.

After selectively removing the insulating pattern 220, the interlayer insulating layer 240 may be formed, and the contact structures 245 passing through the interlayer insulating layer 240 and electrically connected to the source and drain 215 may be formed.

In the present invention, since the sacrificial mask 210 described with reference to FIGS. 8A and 8B may be formed to have a line width smaller than that implemented through a photolithograph process, consequently, it is possible to form a short channel length between the source and drain 215, and to form the gate electrode 227 having a small line width. Therefore, it is possible to form a device having a short channel length.

In addition, the source and drain 215 formed of a metal material layer may be self-aligned with sidewalls of the gate structure 225, or overlap the gate structure 225. As a result, a Schottky barrier FinFET device can be formed.

In addition, since the fin body 205 is used as a channel region, the Schottky barrier FinFET device may be formed to have a channel width greater than that of the conventional Schottky barrier MOSFET device.

Therefore, it is possible to improve current drivability of the device, and operating speed of the device.

As can be seen from the foregoing, the present invention is capable of providing a Schottky barrier FinFET device including a source and a drain which are made of a metal material layer. The Schottky barrier FinFET device may have a short channel length and an increased channel width. In the present invention, the source and drain adjacent to a lower channel region of a gate electrode may be formed of a metal material layer, regardless of the thickness and channel length of a fin. In addition, the source and drain of the Schottky barrier FinFET device of the present invention may be self-aligned with sidewalls of a gate electrode, or overlap the gate structure, while forming a shallow junction. Therefore, it is possible to provide a Schottky barrier FinFET device having an electrically stable short channel length. In addition, it is possible to improve current drivability of the device, and operating speed of the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a FinFET device, comprising:
   forming a fin body on a substrate;
   forming a sacrificial mask crossing over the fin body and covering an upper surface and sidewalls of the fin body;
   forming a source and a drain of a metal material layer forming a Schottky barrier to the fin body on surfaces of the fin body positioned at both sides of the sacrificial mask;
   forming an insulating pattern surrounding sidewalls of the sacrificial mask and covering the fin body;
   removing the sacrificial mask to form an opening for exposing a portion of the fin body; and
   forming a gate structure covering the exposed fin body.

2. The method according to claim 1, wherein the fin body comprises at least one layer selected from the group consisting of a silicon (Si) layer, a germanium (Ge) layer, a silicon germanium (SiGe) layer, a silicon germanium carbide (SiGeC) layer, and a silicon carbide (SiC) layer.

3. The method according to claim 1, wherein the source and drain are formed of a metal silicide layer.

4. The method according to claim 3, wherein the metal silicide layer comprises at least one layer selected from the group consisting of a tantalum silicide (TaSi) layer, a titanium silicide (TiSi) layer, a tungsten silicide (WSi) layer, a nickel silicide (NiSi) layer, a cobalt silicide (CoSi) layer, a platinum silicide (PtSi) layer, an erbium silicide (ErSi) layer, a ytterbium silicide (YbSi) layer, a yttrium silicide (YSi) layer, a gadolinium silicide (GdSi) layer, a Terbium silicide (TbSi) layer, a dysprosium silicide (DySi) layer, a holmium silicide (HoSi) layer, a thulium silicide (TmSi) layer, a lutetium silicide (LuSi) layer, a palladium silicide (PdSi) layer, an osmium silicide (OsSi) layer, an iridium silicide (IrSi) layer, and a rhenium silicide (ReSi) layer.

5. The method according to claim 1, wherein forming the source and drain comprises:
   forming a metal layer on the substrate having the sacrificial layer;
   heat-treating the substrate having the metal layer to react the fin body with the metal layer; and
   removing an unreacted portion of the metal layer.

6. The method according to claim 1, wherein the insulating pattern is formed of a material layer having an etching selectivity with respect to the sacrificial mask.

7. The method according to claim 1, wherein the gate structure is formed of a gate insulating layer and a gate electrode, which are sequentially stacked.

8. The method according to claim 7, wherein the gate insulating layer is formed using a chemical vapor deposition method or an atomic layer deposition method, and the gate electrode comprises at least one layer selected from the group consisting of a silicon layer, a metal layer, and a metal silicide layer.

9. The method according to claim 1, wherein the source and drain are self-aligned with sidewalls of the gate structure, or overlap the gate structure.

10. The method according to claim 1, wherein forming the sacrificial mask comprises:
   forming a preliminary sacrificial mask crossing over the fin body and covering an upper surface and sidewalls of the fin body, the preliminary sacrificial mask having a first width; and
   isotropically etching the preliminary sacrificial mask to cross over the fin body having a second width smaller than the first width.

* * * * *